United States Patent [19]

Nelson

[11] Patent Number: 5,744,213
[45] Date of Patent: Apr. 28, 1998

[54] ENCLOSURE PANEL WITH HERRINGBONE APERTURE PATTERN

[75] Inventor: Thomas E. Nelson, Crestwood, Ky.

[73] Assignee: Soltech, Inc., Louisville, Ky.

[21] Appl. No.: 537,150

[22] Filed: Aug. 25, 1995

[51] Int. Cl.⁶ .............................. A47B 81/06; B32B 3/24
[52] U.S. Cl. .......................... 428/131; 428/134; 428/136; 428/137; 428/220; 428/338; 361/692; 361/693; 312/213; 83/691; 83/681; 83/30; 83/40; 83/39
[58] Field of Search ........................ 428/134, 136, 428/137, 131, 220, 338; 361/692, 693; 312/213; 83/691, 681, 30, 40, 39

[56] References Cited

U.S. PATENT DOCUMENTS

| | | | |
|---|---|---|---|
| 1,858,765 | 5/1932 | Cramer | 312/22 |
| 2,561,094 | 7/1951 | Chadwick | 312/329 |
| 3,192,306 | 6/1965 | Skonnord | 174/16.1 |
| 3,476,455 | 11/1969 | Barecki et al. | 312/8.9 |
| 3,649,430 | 3/1972 | Lewis et al | 428/137 |
| 3,655,501 | 4/1972 | Tesch | 161/109 |
| 3,660,702 | 5/1972 | Kishino | 310/61 |
| 4,837,249 | 6/1989 | O'Mara et al. | 523/175 |
| 4,893,667 | 1/1990 | Dunn | 160/236 |
| 5,290,456 | 3/1994 | Losack | 210/767 |

*Primary Examiner*—William Watkins
*Attorney, Agent, or Firm*—Woodard, Emhardt, Naughton Moriarty & McNett

[57] ABSTRACT

An enclosure panel for covering the access opening in an equipment compartment includes a main panel body which is constructed and arranged so as to attach directly to the equipment compartment in such a way as to substantially cover the access opening. The main panel body defines a plurality of oblong slots which are arranged into a plurality of side-by-side columns wherein each column is configured with a substantially uniform herringbone pattern. The herringbone pattern provides a unique and preferred compromise between a uniform pattern of oblong slots arranged in columns and rows and a uniform pattern of circular openings arranged in staggered rows and columns. By use of the uniform herringbone pattern the open area for preferred cooling air flow is achieved while at the same time maintaining the structural strength and integrity of the enclosure panel.

13 Claims, 7 Drawing Sheets

ENCLOSURE PANEL WITH HERRINGBONE APERTURE PATTERN

BACKGROUND OF THE INVENTION

The present invention relates in general to the design and use of enclosure panels for electrical equipment and household appliances. More specifically the present invention relates to the use of a unique aperture pattern as part of an enclosure panel so as to provide a preferred balance between air flow, noise reduction, structural strength and intrusion prevention into machine compartments.

The design of most common household appliances such as refrigerators, freezers, dishwashers and room air conditioners includes a machine or equipment compartment that houses the major working components such as motors, compressors, blowers, and valves. A typical design trade off occurs between the efficiency requirements of motors and compressors which require air flow through the machine compartment for cooling and for heat transfer and the need to shield the noise which is generated by these equipment components. It is also necessary to prevent accidental intrusion of fingers or hands into the machine compartment and this further restricts the design configuration. A typical approach used in the design of such equipment is to provide a machine compartment cover that is assembled in place over an access opening after the motor, compressor, blower, or other components have been installed in the desired position within the machine compartment of the appliance. The removal of this aperture cover serves as the means of access to the various items of equipment whenever service to the particular appliance or device may be required.

As will be clear from the following explanation, there needs to be a trade off between the requirement for air flow for cooling into and out of the machine compartment, the desire or need to insulate the equipment compartment so as to reduce noise, and a restriction on opening sizes and orientations to prevent accidental intrusion. One common approach in order to achieve the desired trade off is to provide a cover panel for the access opening with a predetermined number of air vent apertures. The number, size, and location of such apertures is determined based upon the rate of air flow and the cooling requirements for the equipment installed in the compartment, as well as the regulatory requirement that inadvertent access to the electrical components be prevented. While an increase in the number or size of apertures would obviously enhance the overall cooling, increasing the number or size of these apertures would also contribute to more noise being allowed to pass to the outside environment and permit possible inadvertent access into the electrical compartment by the user.

A further concern involves the need to maintain the structural strength and integrity of the access cover panel. The structural strength of the panel is important during shipping, handling and general movement of the appliance between its point of manufacture and the customer or ultimate end user. There is also some desire for structural strength to this access cover panel as it will be removed and reassembled during servicing of the components in the equipment compartment.

Typical prior art designs for an access cover panel are illustrated in FIGS. 1, 1A, 1B, and 2 which represent the generally accepted state of the art. The equipment cabinet 20 represents an enclosure for electrical equipment or equally a household appliance. Unit 21 is intended to represent a noise and heat generating item such as a compressor or fan. The removable enclosure panel (access cover) 24 is designed to attach to the rear wall of the equipment cabinet. As illustrated, panel 24 is provided with a sound insulation panel 30 in order to provide additional noise reduction. As illustrated in FIG. 1, the pattern of apertures designed for air flow involves a uniform pattern of oblong slots arranged into horizontal rows and vertical columns. Alternative configurations for prior art enclosure panels 24a and 24b are illustrated in FIGS. 1A and 1B. In the FIG. 2 alternative, circular apertures are provided in a staggered row and column pattern.

The material selected for these prior art enclosures, such as enclosure panel 24, may be steel, plastic, or fiberboard. As compared to fiberboard, steel and plastic involve higher cost materials which require more expensive tooling and are not particularly good in reducing noise due to vibration. However, steel can be modified for enhanced acoustical performance by assembling sound absorbing materials and vibration damping materials to the metal enclosure. The preferred choice for structural integrity however is steel or plastic. Both steel and plastic also permit the use of intricate forming options for the vent hole pattern, even though both would involve more costly design requirements. Although steel or plastic may have desirable benefits for certain applications, when the higher costs and tooling requirements are considered, and when the appliance or equipment design does not require steel or plastic, the use of fiberboard represents a more desirable and more practical choice. It is also possible to incorporate chemicals into the fiberboard to provide electrical insulating properties and flame retardency.

Most manufacturers also have several different designs of enclosure panels for their various appliances and equipment and some of these designs change as new models are introduced. In view of the higher tooling costs for steel and plastic, these constantly changing designs provide one more reason why these two materials may not be the most appropriate. Steel reverberates more easily and the vibration results in greater noise transmission. Some molded plastics have difficulty meeting the requirements for non-flammability and structural abuse. Consequently, fiberboard has become a popular choice of certain appliance manufacturers. Fiberboard material is low cost, easy to fabricate, and does not readily vibrate which would tend to transmit and/or amplify internal noises more easily. Individual part cost is somewhat more economical with fiberboard, due to more economical tooling, and fiberboard material is able to meet the structural strength requirements.

Fiberboard is a multicomponent material made in a process similar to making paper. Usually fiber from corrugated paper products or paperboard are combined with chemicals and dyes in a slurry, metered to the desired thickness, then dried and compressed in order to achieve certain property requirements including flame retardency, electrical capacitance, puncture resistance, and tear resistance.

With a constant trend toward higher efficiency appliances, machine components such as compressors are required to be more efficient. These greater demands normally lead to noisier, hotter running components, thus increasing the need for adequate air flow through the machine compartment and thus leading to more noise escaping from the machine compartment. In order to achieve what is believed to be an optimum balance between air flow and the escaping or transmitted noise, it is important to localize the desired number of air vent holes or apertures in the access cover in an area which is in close proximity to the air flow stream created by a forced air fan or other air moving equipment. This localizing of the air vent apertures allows additional sound insulation material to be adhered to the other portions of the enclosure panel (access cover) while not blocking or interfering with the air flow through the vent apertures. This also limits accessing electrical components while the cover is in place. In order to keep the vent area as small as possible, it is necessary to find a geometry that maximizes the open area of vent holes in the fiberboard while allowing the cover to maintain the strength requirements of the design. It is also important to localize these air vent apertures so as to minimize the required panel area which is dedicated to the air flow apertures. The greater the area of the enclosure panel which does not receive air vent apertures simply means that there is a greater area for applying other sound insulation material.

As illustrated in FIGS. 1, 1A, and 1B, the various patterns which are presently employed involve a uniform pattern of uniform oblong slots arranged into rows and columns. As can be seen from the illustrations of FIGS. 1 and 1A, there is a horizontal bridge web between adjacent rows of oblong slots as well as vertical web portions between adjacent columns of oblong slots. It has also been determined that a ratio of the slot length to the slot width which is equal to or greater than 2:1 weakens the enclosure panel. Given a defined area for the air vent apertures, increasing the length of the oblong slots reduces the width of the web portion between adjacent columns as well as increasing the separation between adjacent web portions. This results in weakening of the enclosure panel. If the enclosure panel is subject to vertical forces or forces with a vertical component (such as diagonal forces), the panel is subject to tearing deformation or breakage, regardless of the material used in its construction. Any of these conditions could have a significant impact on the performance and safety features of the design.

If the slots are oriented vertically, the panel would be most susceptible to damage if subjected to forces with a horizontal component. General handling, shipping, and installation of appliances can subject the cover to horizontal, vertical, and torsional forces. Additionally, opening and closing a heavy refrigerator door can do the same. The same design criteria and general structural conditions also apply to common vent configurations as shown in FIG. 1B. An additional consideration with this structure is that while the louvers formed in the fabrication process can be used to direct air flow, they are also an air flow restriction by creating additional flow resistance which can compromise the necessary cooling effect required for proper performance.

One improvement to the generally accepted structures of FIGS. 1, 1A, and 1B is a pattern of circular apertures. A pattern of circular apertures (see FIG. 2) which is offset or staggered row to row and column to column results in an improved bridging pattern, assuming appropriate spacing. However, the open area which is provided is less than that provided by the oblong slots. By offsetting or staggering the rows and columns, the length of any web portion is reduced and the dimension between adjacent web portions is likewise reduced. However, as explained, in order to get adequate air flow, the number of circular apertures would have to be increased and the area of the enclosure panel used for such apertures would have to be increased. Alternatively, while the sizes of the circular apertures could be increased, this would allow intrusion by fingers. The regulations which are applicable to these types of enclosure panels do not provide approval if a probe of one-half (½) inch diameter can penetrate the cover. This is referred to as the "probe test".

Considering the various factors and concerns, the following criteria determine a cover with optimum features to address strength, air flow, safety, accidental intrusion, and noise.

1. The aperture configuration must allow for a sufficient total open area for air flow through the enclosure panel and yet allow for a significant solid area for attaching acoustical insulation and to prevent general sound transmission.
2. Individual apertures should generally be sized so as to prevent the passages of a one-half (½) inch diameter probe through the enclosure.
3. Material bridging should have a diagonal component to resist forces with vertical, diagonal, and horizontal force vectors.
4. Each individual aperture should have maximum open area to reduce resistance to air flow. In this regard, a slot performs better than a hole.

After evaluating the various shortcomings with existing enclosure panel designs, a new aperture pattern has been conceived which is believed to provide the best balance between air flow and the desired structural strength or integrity for the enclosure panel while still providing the necessary safety. What has been conceived and what is described and claimed is a type of herringbone pattern of oblong slots. This herringbone pattern provides the greater flow area which is desired within a limited area on the enclosure panel while at the same time providing a staggered and offset bridge network so that the web portions between adjacent apertures more closely simulate what is achieved by the circular aperture pattern of FIG. 2. The enclosure panel of the present invention which includes a herringbone pattern of oblong slots is believed to provide the best balance between competing needs and represents a design which is novel and unobvious.

This aperture pattern allows the use of slots for maximum open area per individual opening through the enclosure panel. These slots are sized to prevent accidental intrusion through the panel and thus pass the require probe test while allowing for more individual open area than a circular hole that would pass the same test. The increased individual open area of each aperture decreases the resistance to air flow. The diagonal orientation and staggered offset bridge network provides superior strength in all general use conditions, regardless of the chosen material. Horizontal, vertical, and torsional forces are resisted by this diagonal bracing.

SUMMARY OF THE INVENTION

An enclosure panel for closing an access opening in a compartment with a heat-generating and noise-generating component therein according to one embodiment of the present invention comprises a main panel body constructed and arranged to be attachable to the compartment so as to substantially cover the access opening. A plurality of oblong slots are defined by the main panel body, the plurality of oblong slots being arranged into a plurality of columns, the columns being configured with a substantially uniform herringbone pattern.

A method of fabricating an enclosure panel for the access opening of an equipment compartment according to another embodiment of the present invention comprises the steps of first providing a sheet of fiberboard material, next blanking out an enclosure panel blank from the sheet of fiberboard material, and then punching a plurality of oblong slots in the enclosure panel blank, the plurality of oblong slots being arranged into a substantially uniform herringbone pattern.

One object of the present invention is to provide an improved enclosure panel for closing an access opening of an equipment compartment.

Another object of the present invention is to provide an improved method of fabricating an enclosure panel for the access opening of an equipment compartment.

Related objects and advantages of the present invention will be apparent from the following description.

DESCRIPTION OF THE PREFERRED EMBODIMENT

Figure 1:
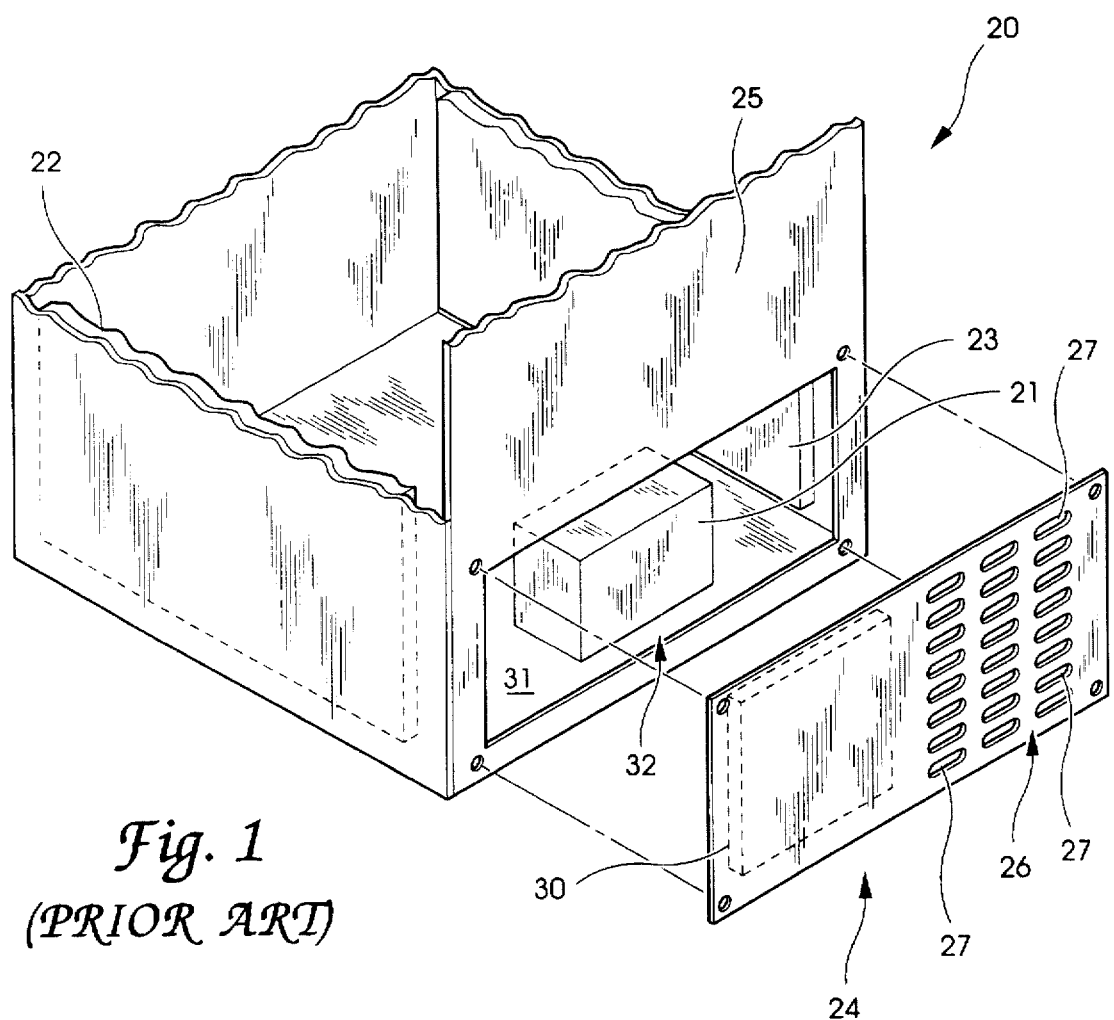
FIG. 1 is a partial, exploded perspective view of an equipment cabinet and enclosing panel for an equipment compartment which is representative of a prior art design.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to FIGS. 1, 1A, 1B, and 2, various prior art designs relating to venting enclosure panels are illustrated.

In FIG. 1, equipment cabinet 20 represents an enclosure for electrical equipment or equally a household appliance. Unit 21 is intended to diagrammatically represent a noise and heat generating item such as a compressor, motor, or fan/blower. Sound insulation panels 22 and 23 are located on the inside of cabinet 20 in order to provide additional noise reduction. Removable enclosure panel 24 is designed to attach to rear wall 25 by means of four threaded fasteners. Enclosure panel 24 is provided with a repeating pattern 26 of uniform oblong slots 27. Panel 24 is also provided with a sound insulation panel 30 in order to provide additional noise reduction. Panel 30 is a thickness of acoustical insulation material. Panels 24a, 24b, and 34 represent alternative designs.

As discussed in the Background of the Invention, most common household appliances and many items of electrical equipment include a machine compartment 31 within the equipment cabinet 20 that houses the major components such as motors, compressors, fans, blowers, and valves. There is a design trade off between the desired air flow for cooling ventilation (for the operating efficiency of the components within the machine compartment) and the noise level which may be transmitted from within the equipment cabinet. By venting the enclosure panel 24, air flow and cooling can be increased over what would otherwise be available if the enclosure panel 24 was applied to the access opening 32 without any ventilation. While the pattern 26 of oblong slots 27 clearly improves the design in one aspect, these oblong slot apertures also allow more noise to be transmitted and are susceptible to deformation, tearing, and breakage. The mentioned trade off is to provide enough vent apertures for the minimum required cooling and otherwise apply sound insulation panels to the non-vented surfaces of the machine compartment 31. These other sound insulation panels would be applied not only to the walls of the equipment cabinet but also to that portion of the enclosure panel which is not used for the vent apertures.

Enclosure panel 24 is typical or representative of one attempt at the described trade off between noise reduction and cooling or ventilation. If panel 24 is designed without the pattern 26 of oblong slots 27 (i.e., vent openings), a larger sound insulation panel 30 could be applied in that area and there would, as a result of this, be more noise reduction or restriction. However, without the vent openings, the flow of cooling air is restricted and an escape path for the hotter air is virtually nonexistent. If greater cooling is desired, the number and/or sizes of oblong slots 27 could be increased, but this would in turn create a larger open area for noise to escape, would weaken the panel structurally and may allow accidental intrusion.

One further aspect of enclosure panel 24 relates to the area which is dedicated to the vent apertures in comparison to the overall size of the enclosure panel blank. It is usually possible to focus the cooling air flow through the equipment cabinet and thus the location for the venting apertures not only should be focused and localized but in fact can be. Any vent apertures which are located outside of the determined localized area will not maximize the cooling efficiency for such apertures and thus it is important to confine the pattern of apertures to a fairly small area. The problem with this particular approach is one of structural strength or integrity for the enclosure panel. It is not a problem to provide 50 square inches of venting apertures in a panel blank of 100 square inches. It is an entirely different matter to try and localize 50 square inches of vent openings in an area which may measure 60 or 70 square inches. The small amount of material which is left between the rows and columns of oblong slots as illustrated in FIG. 1 can represent a fairly small bridge line or web portion. With a uniform pattern as illustrated in FIG. 1, there is a web portion between adjacent columns of oblong slots and a bridge or web which extends horizontally between adjacent rows of oblong slots. As the length to width ratio of the oblong slots increases in order to provide greater vent area in the localized region, the width of the web portions between adjacent columns becomes smaller and the spacing between adjacent web portions becomes greater. This then reduces the structural strength of the enclosure panel.

Figure 1A:
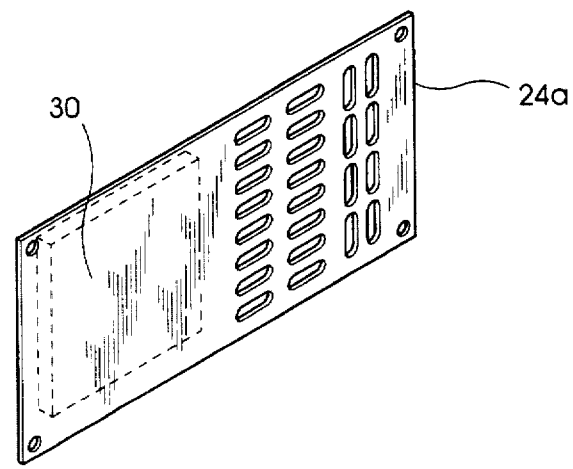
FIG. 1A is a perspective view of an alternative enclosing panel suitable for use on the FIG. 1 equipment cabinet.
Figure 1B:
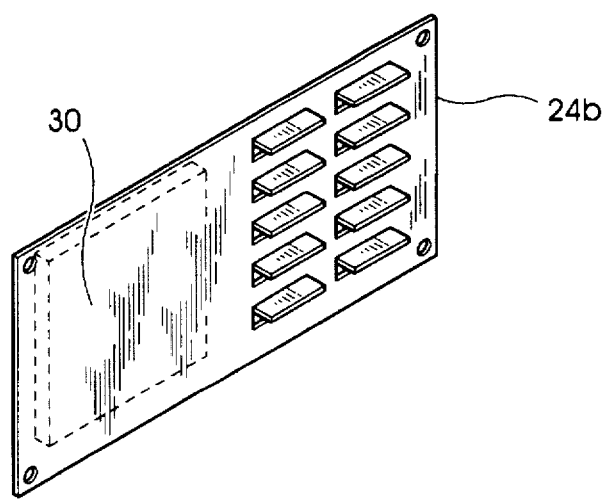
FIG. 1B is a perspective view of an alternative enclosing panel suitable for use on the FIG. 1 equipment cabinet.

FIG. 1A illustrates an alternative panel design in panel 24a which may be used on cabinet 20 as a replacement for panel 24. FIG. 1B illustrates a still further alternative panel design which is suitable as a replacement for panel 24.

Figure 2:
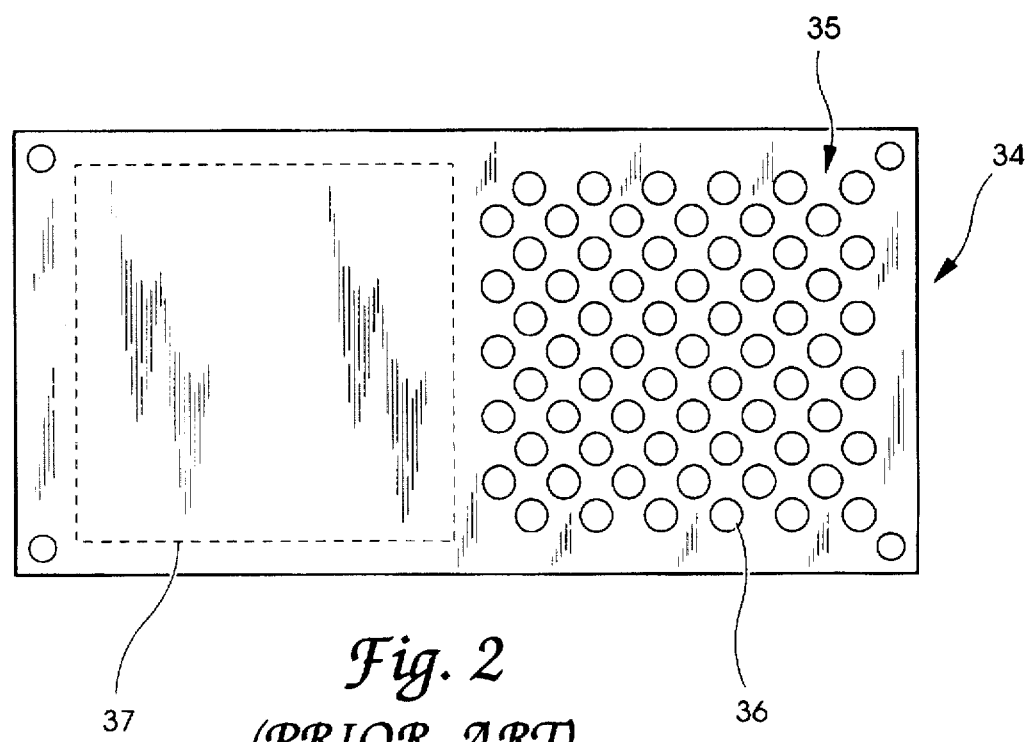
FIG. 2 is a front elevational view of an enclosure panel suitable for use in the FIG. 1 assembly including an alternative prior art aperture pattern.

One approach which has been tried in order to improve the structural strength and integrity of the enclosure panel is to go to a pattern of circular holes or apertures as is illustrated in the prior art design of FIG. 2. The FIG. 2 enclosure panel 34 includes a uniform pattern 35 of circular apertures 36. Pattern 35 is still confined to the same area as pattern 26, but the staggered rows and columns of circular openings 36 result in improved structural strength to the enclosure panel. One of the aspects of the FIG. 2 design is that whatever bridges or web portions may be defined by this pattern 35, these web portions are to some extent more random in orientation as they do not involve long vertical or horizontal bridge strips.

While panels 24 and 34 are to some degree equivalent, there are differences in the spacing and separation distance between adjacent rows and columns of circular apertures 36 and oblong slots 27. On the one hand, the circular apertures 36 enhance or improve the structural strength of the enclosure panel, but as a trade off there is less open area for air flow and cooling ventilation. If the size of each circular aperture is increased substantially, what results is an extremely thin web portion between adjacent apertures which could ultimately weaken the enclosure panel while still not maximizing the open vent areas for air flow. What can be seen by the FIG. 2 circular aperture pattern is that in any four aperture cluster there is a diamond outline or shape created by connecting the centers of the four circular apertures. The side length of this diamond shape is such that the two adjacent circular apertures may only be so close to each other without touching. The closer they become, the thinner the web portion in between. There is though a relatively large area left in the center of this four sided diamond pattern which represents part of the overall inefficiencies of this design with regard to the amount of open area for ventilating air flow. Also there is the need for many more apertures of this circular shape than would be required for slots in order to give the same overall open area. The increased web areas between the circular apertures creates greater resistance to air flow.

With regard to the FIG. 1 design it has been found that if the length to width ratio is 2:1 or greater, the panel will be structurally weakened due to a reduction in the web portion dimensions and an increase in their spacing as well as the lack of diagonal bracing. The staggered hole pattern of panel 34 provides good bridging and better structural strength but the total open area is decreased as is the individual aperture open area.

Figure 3:
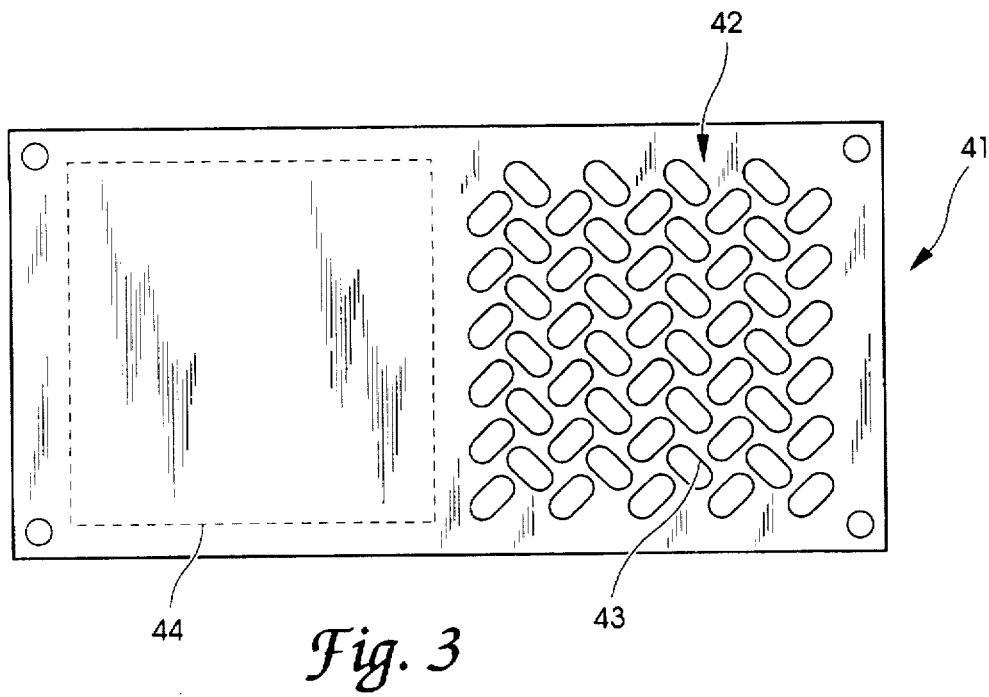
FIG. 3 is a front elevational view of an enclosure panel for the access opening of an equipment compartment according to a typical embodiment of the present invention.
Figure 4:
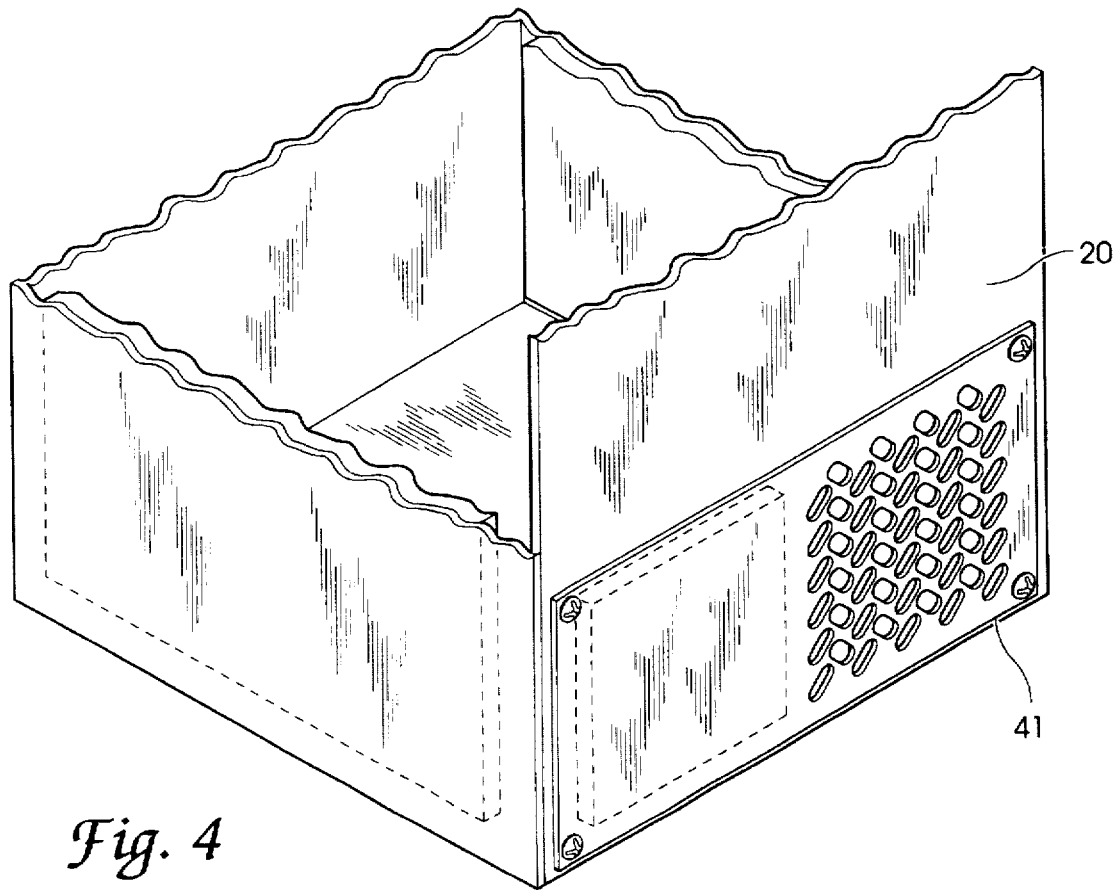
FIG. 4 is a partial perspective view of the FIG. 3 enclosure panel as assembled over the access opening of an equipment compartment.

The design objective of the present invention was to first dedicate a portion of the enclosing panel 24 or 34 for receipt of a repeating aperture pattern. Next the size, shape, and spacing of the apertures needed to be selected to maximize the open area while not structurally weakening the enclosing panel such that it becomes unsuitable for its intended purpose. One solution to the design trade off between a pattern of oblong slots and a pattern of circular openings is represented by the FIG. 3 illustration in accordance with the present invention. In FIG. 3 the enclosure panel 41 is configured with a repeating herringbone pattern 42 of angled or inclined and staggered oblong slots 43. This pattern design in accordance with the present invention provides the best balance between air flow capacity and structural strength due to the bridging web portions which are left in the panel between and around each oblong slot 43 in the illustrated herringbone pattern 42. When the enclosure panel 41 is fabricated out of a fiberboard or chipboard material, the described herringbone pattern cooperates with the random, fibrous nature of the fiberboard to enhance the structural strength of the enclosure panel. FIG. 4 illustrates enclosure panel 41 as it is attached to equipment cabinet 20 so as to enclose the machine compartment 31. Panel 44 is attached to enclosure panel 41 and the material selection for panel 44 determines its primary function. If sound level reduction is the objective, sound insulation material is selected. If vibration dampening is the objective, vibration dampening material is selected. Various combinations are also possible in the form of lamination layers.

Regardless of the dynamics of the pattern in balancing or optimizing the open area for air flow and cooling ventilation and the structural strength of the panel, it is necessary to be able to fabricate the selected panel material into the desired configuration. Most appliance manufacturers produce millions of units per year, thus requiring an aperture pattern that can be readily produced in high volumes with reliable tooling and machine methods. However, they also have numerous molds and sizes that then require that they use many different size closure panels in some cases requiring different numbers of apertures or the amount of open area. By concentrating the aperture pattern in a small area of the enclosure panel, the fabrication process becomes more demanding. The pressure or force required to punch or cut a hole pattern in either fiberboard, metal, or plastic increases as the total lineal amount of hole or slot perimeter increases. Because of the number of holes or apertures required to achieve an adequate air flow and the need to keep these apertures in the proximity of the air flow path which is generated through the equipment cabinet, the task of cutting the aperture pattern becomes extremely difficult.

To attempt to cut or punch the desired aperture pattern using a mechanical or hydraulic punch press or using a similar die cutting method may cause the tonnage requirements for the die to either become excessive or actually exceed the capacity of many standard presses. It may also be necessary to have dozens of different tools for different models, necessitating undesirable levels of tooling complexity and expenditure levels. Even if the proper tonnage can be achieved, the complexity of a single tool (attempting to cut the part in one operation) would be such that the level of reliability required for millions of strokes at high speed might not be attainable.

Figure 5:
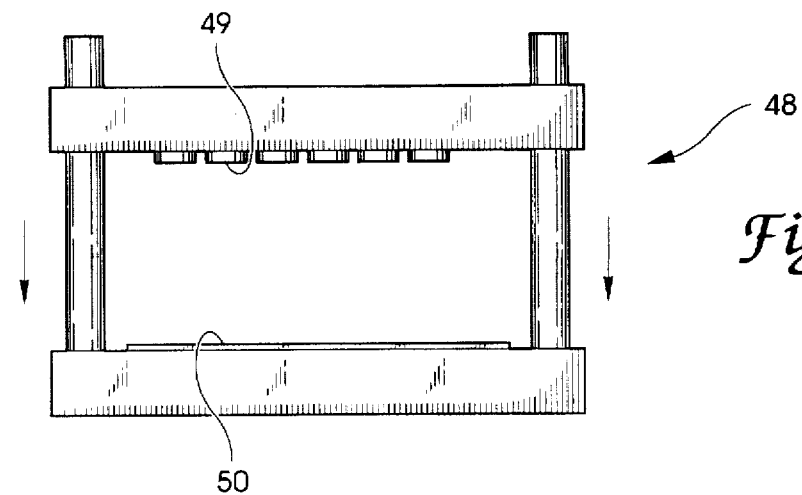
FIG. 5 is a front elevational view of a punching/blanking die which may be used for fabrication of the FIG. 3 enclosure panel.

FIG. 5 represents in diagrammatic form a punch press 48 which may either be mechanical or hydraulic. The upper platten of the punch press includes a punching or blanking die 49 and a sheet of material constituting the workpiece 50 is disposed on the lower platten. In operation the upper platten moves in the direction of the illustrated arrows so as to cut, punch, or blank some portion out of or into workpiece 50. The specifics of punch press design, whether mechanical or hydraulic, are believed to be well known to those of ordinary skill in the art. The purposes of the FIG. 5 illustration is simply to represent that punch press operation is the preferred method for fabrication of the enclosure panels described herein. It is also to be understood that the use of a punch press for either a cutting, blanking, or punching operation can be used with different objectives and a different sequence of processing steps. For example, if fiberboard material is being used for the enclosure panel, the beginning sheet of material may already be cut and trimmed to the desired width. The beginning sheet of material may also be cut and trimmed to the desired length whether for one enclosure panel or for a series of enclosure panels as illustrated in FIGS. 6 and 7.

Figure 6:
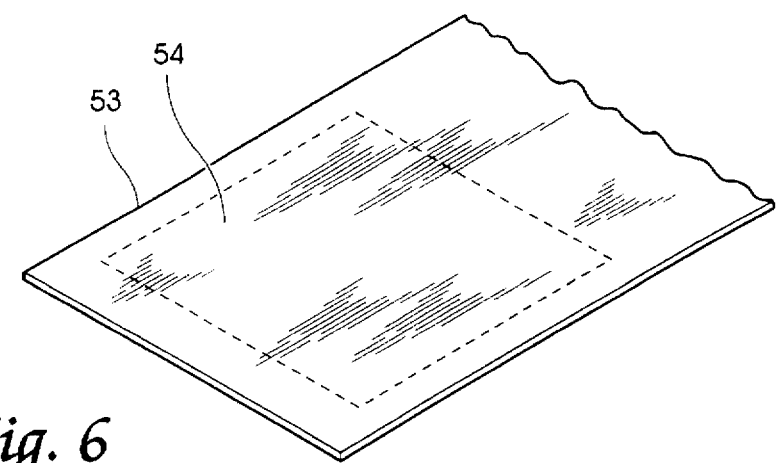
FIG. 6 is a partial perspective view of a sheet of fiberboard material from which the blank for the FIG. 3 enclosure panel is to be blanked.
Figure 7:
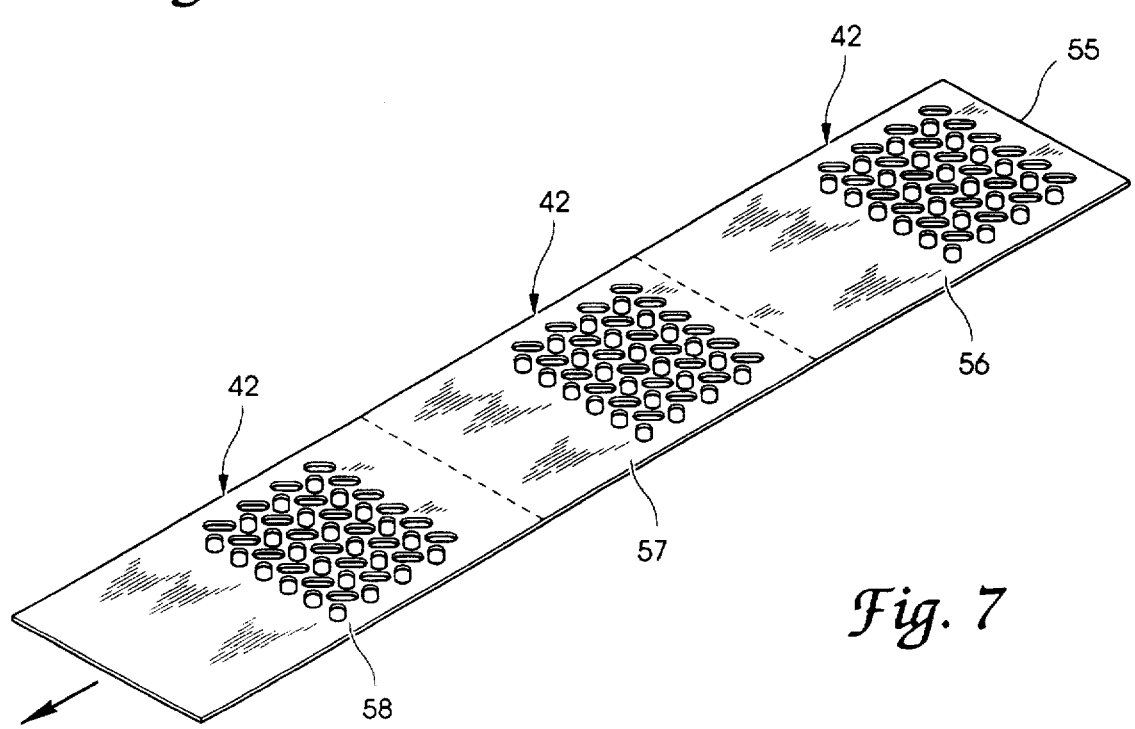
FIG. 7 is a perspective view of a sheet of fiberboard material with the herringbone aperture pattern of the FIG. 3 enclosure panel as that pattern would be punched using a progressive die.

FIG. 6 represents a situation where the beginning sheet 53 of fiberboard (or metal) material is over-sized from that desired for the enclosure panel and the first processing step is to blank out enclosure panel blank 54. Blank 54 may be sized for a single enclosure panel or may be of a longer or wider dimension from which two or more enclosure panels may result. Blank 54 may also have a more complex perimeter shape to accommodate other structural or mechanical features of the appliance. One such possibility is illustrated in FIG. 7 where the blank 55 of fiberboard material has the correct width and the necessary length for three enclosure panels. While one option is to punch or cut the desired herringbone pattern 42 into each enclosure panel 56–58 concurrently or simultaneously, this would require a punch press with an extremely high tonnage capacity considering the lineal extent or edge length required for all of the oblong apertures as well as the number of panels. Under the circumstances it is believed that the preferred approach for fabricating a number of enclosure panels from a longer blank of fiberboard material is to process the blank through a progressive die arrangement.

With a progressive die arrangement, the first panel to be handled by the punch press has a portion of the herringbone pattern partially cut through the thickness of the fiberboard material. As this first panel (panel 58 noting the direction of the arrow) moves to the next station in the progressive die, the following panel (panel 57) arrives at the first station of the progressive die. As the second panel receives its initial and partial punch of the herringbone pattern, the first pattern in panel 58 is cut or punched deeper. With the next indexing step, the first panel moves to the third and final station while the second panel moves to the second station and the third panel (panel 56) moves to the initial station in the progressive die. With this particular approach, a much longer sheet of fiberboard material could be utilized with a constant feed through the progressive die with a final cutting or trimming step at the end in order to separate each individual panel from the larger, longer blank.

Figure 7A:
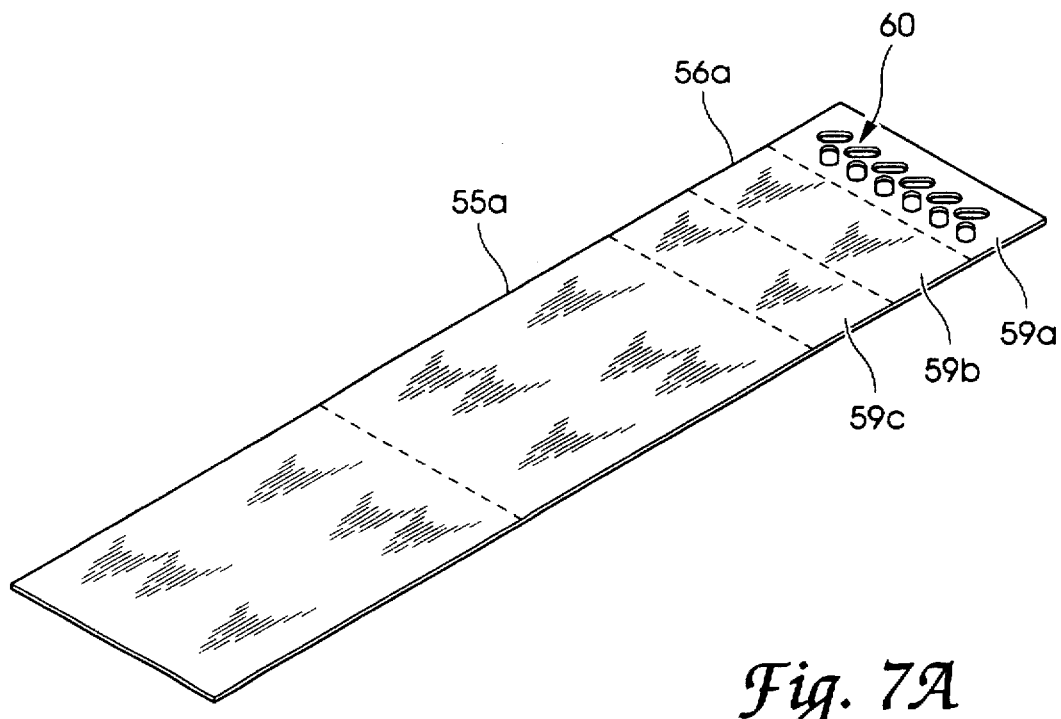
FIG. 7A is a perspective view of a sheet of fiberboard material with a partial herringbone pattern which is fabricated by an alternative method according to the present invention.

Another fabrication option is to use a series of progressive steps whereby a portion of the total herringbone pattern is cut all the way through at the first station or position and indexed forward to cut a repetitive pattern all the way through the panel (see FIG. 7A).

Referring to FIG. 7A, the beginning blank of fiberboard 55a is illustrated with the first panel 56a segmented into three sections 59a, 59b, and 59c. The partial herringbone pattern 60 represents one-third of the pattern which is to be punched into the completed panel 56a. The FIG. 7A illustration is representative of the fabrication method wherein a portion (pattern 60) of the total herringbone pattern for the panel is punched completely through at the first stage. The first fabrication step which is illustrated is to punch pattern 60 into section 59a. The second step in the repetitive process is to punch an identical herringbone pattern into section 59b. The third and final step in the fabrication of panel 56a is to punch a third identical herringbone pattern into section 59c. These three punching steps complete panel 56 and the blank is then moved to begin fabrication of the next panel. Adjacent panels can be cut from the larger blank at any time after the panel is fabricated by having the complete herringbone pattern punched into the panel.

The specific pattern of six columns of diagonally-arranged oblong slots can be varied. For example, a panel for a large refrigerator may need ten columns and this would require five punching operations.

Figures 9, 10:
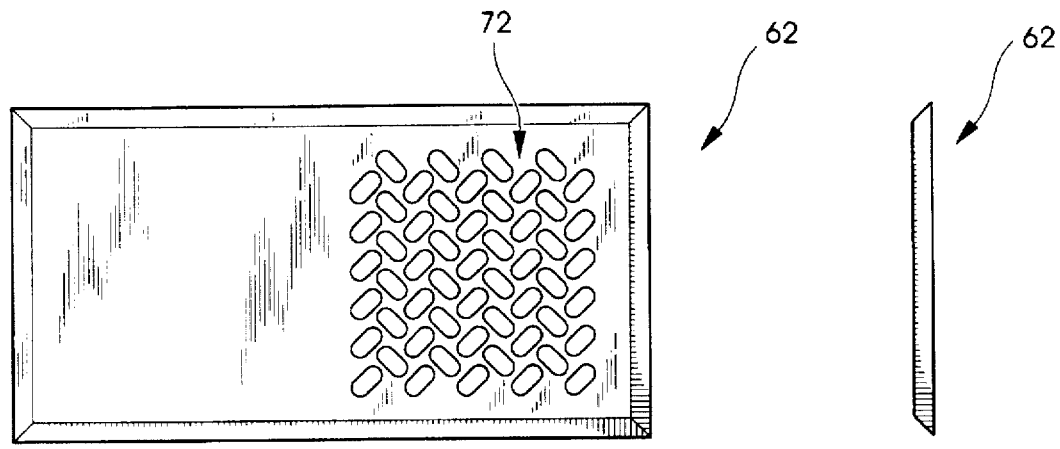
FIG. 9 is a front elevational view of the FIG. 8 enclosure panel blank as assembled with the outer peripheral edges bent and secure and a herringbone pattern of apertures punched into the FIG. 8 blank.
FIG. 10 is a side elevational view of the FIG. 9 assembled enclosure panel.
Figure 8:
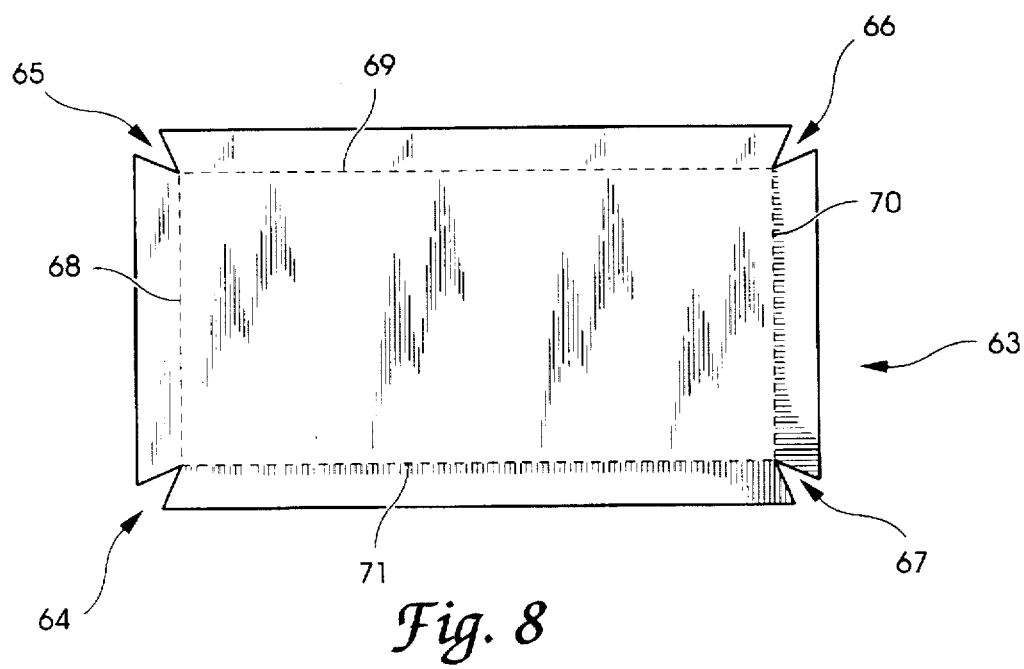
FIG. 8 is a front elevational view of a starting enclosure panel blank according to a typical embodiment of the present invention.

In addition to the use of the fiberboard for enclosure panels 24, 34, and 41, these panels may be fabricated out of metal or plastic. If additional stiffening or if additional depth into the machine compartment is required or desired for the enclosure panel and the selected material is foldable for formable, the outer edges of the panel can be folded and secured into a box-form as illustrated in FIGS. 8–10. An alternative fabrication option is to mold or vacuum form plastic into the desired shape and then machine or stamp the herringbone pattern. The formed box 62 begins as a substantially flat panel 63 (see FIG. 8) with notched corners 64–67 and corresponding fold lines 68–71. The desired herringbone pattern 72 is next machined or punched into panel 63 after which operation the peripheral portions are folded along the designated fold lines and the notched edges joined together in order to create the corresponding box 62. The order of these fabrication steps can be reversed. The peripheral edges and corner notches may be secured together through the use of staples, by adhesive, tape, or in the case of sheet metal by riveting or welding. Welding is an option if the panel 63 is metal. The means of securing will depend to some extent on the material selected for panel 63 and the required strength and rigidity of the formed box 62.

Figure 11:
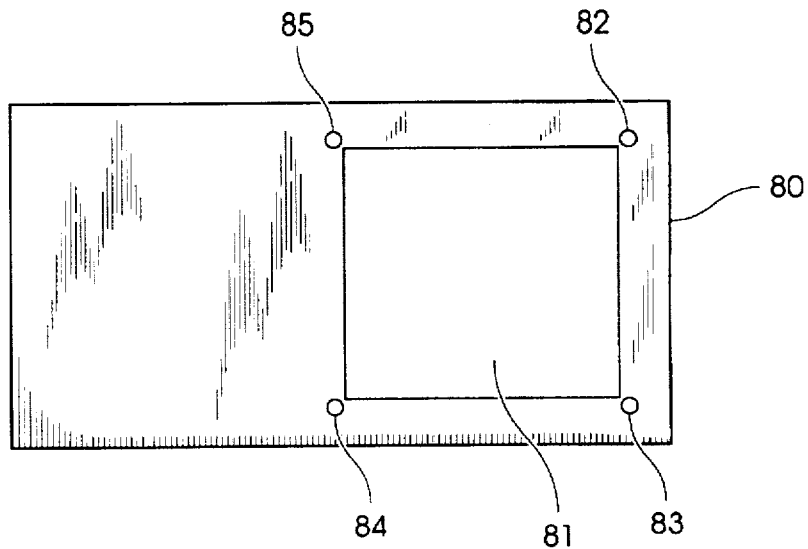
FIG. 11 is a front elevational view of an enclosure panel as a starting blank without any aperture pattern.
Figure 12:
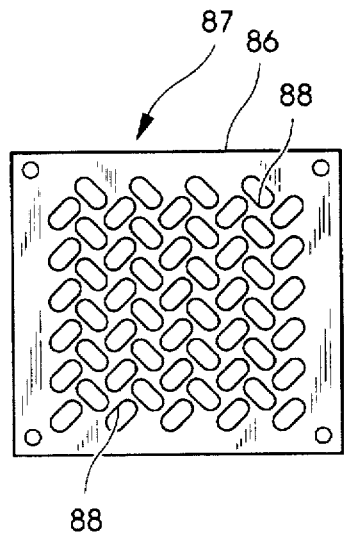
FIG. 12 is a front elevational view of an insert panel for the FIG. 11 enclosure panel having a herringbone pattern.
Figure 13:
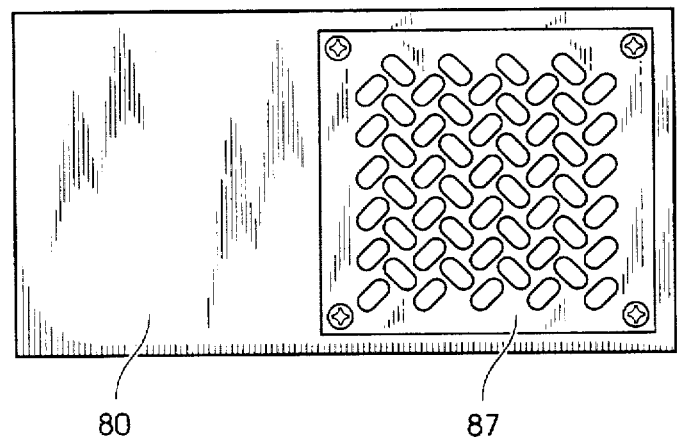
FIG. 13 is a front elevational view of the FIG. 12 insert panel as assembled to the FIG. 11 enclosure panel blank.

Referring to FIGS. 11–13, one further embodiment of the present invention is illustrated. In FIG. 11 a beginning enclosure panel blank 80 is illustrated including a cut out portion 81 and four corner mounting holes 82–85. In FIG. 12 an insert panel 86 is illustrated, including herringbone pattern 87 of uniform oblong slots 88. There are four holes in the corner of insert panel 86 which correspond to the four hole locations in enclosure panel blank 80. As illustrated in FIG. 13, insert panel 86 is to be assembled and secured in position over opening 81 by matching up the two four-hole patterns and using appropriate mounting hardware, or stapling, etc.

Although the resulting structure as illustrated in FIG. 13 is substantially the same as the enclosure panel of FIG. 3, this particular manufacturing and assembly concept provides one advantage. This advantage is that the beginning enclosure panel blank 80, which may be fabricated from fiberboard or similar material, can be processed off-line and readied for the final assembly involving fairly basic cutting and machining operations. The more involved punching or machining operations in order to create the herringbone pattern of insert panel 86 can then be performed on a smaller blank of material involving less size, weight, and fewer handling problems or demands. It would also be possible to make a composite enclosure panel by this technique where the panel blank 80 could be fiberboard material while the insert panel 86 might be plastic or metal. Although plastic and metal both have disadvantages from the standpoint of vibration and noise transmission, those problems would not be as severe if the amount of plastic or metal was reduced to a much smaller panel size such as the smaller size of insert panel 86. As a design alternative, vibration damping materials can be attached to the metal to prevent vibration and noise transmission. It might also be possible to mold insert panel 86 out of plastic as a further design technique or option.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. An enclosure panel for closing an access opening in a compartment with a heat-generating and noise-generating component therein, said enclosure panel comprising:

a main panel body constructed and arranged to be attachable to said compartment so as to substantially cover said access opening; wherein said main panel body defines an insert opening and said insert opening has an insert opening cover; and a plurality of oblong slots defined by said insert opening cover, said plurality of oblong slots arranged into a plurality of columns, each column being configured with a substantially uniform herringbone pattern.

2. The enclosure panel of claim 1 wherein said enclosure panel is fabricated out of a fiberboard material.

3. The enclosure panel of claim 1 wherein said enclosure panel is fabricated out of a plastic material.

4. The enclosure panel of claim 1 wherein said enclosure panel is fabricated out of metal.

5. The enclosure panel of claim 4 which further includes a vibration damping panel applied to said main panel body.

6. The enclosure panel of claim 1 wherein each oblong slot has a length dimension and a width dimension, the length to width ratio being substantially 2:1.

7. The enclosure panel of claim 6 wherein said enclosure panel is fabricated out of a fiberboard material.

8. The enclosure panel of claim 7 further including a thickness of acoustical insulation applied to said main panel body.

9. A method of fabricating an enclosure panel for the access opening of an equipment compartment, said method comprising the following steps:

providing a sheet of panel material;

blanking out an enclosure panel from said sheet of panel material;

cutting an insert opening in said enclosure panel blank;

providing an insert opening cover;

punching a plurality of oblong slots in said insert opening cover, said plurality of oblong slots being arranged into a substantially uniform herringbone pattern; and attaching said insert opening cover over said insert opening.

10. A method of fabricating an enclosure panel for the access opening of an equipment compartment, said method comprising the following steps:

providing a sheet of panel material;

cutting an insert opening in said sheet of panel material;

blanking out an enclosure panel from said sheet of panel material, said enclosure panel including said insert opening;

providing an insert opening cover;

punching a plurality of oblong slots in said insert opening cover, said plurality of oblong slots being arranged into a substantially uniform herringbone pattern; and attaching said insert opening cover over said insert opening.

11. A method of fabricating an enclosure panel for the access opening of an equipment compartment, said method comprising the following steps:

providing an enclosure panel with an insert opening therein;

providing an insert opening cover;

punching a plurality of oblong slots in said insert opening cover, said plurality of oblong slots being arranged into a substantially uniform herringbone pattern; and attaching said insert opening cover over said insert opening.

12. The enclosure panel of claim 1 wherein said main panel body is fabricated out of a fiberboard material and said insert opening cover is fabricated out of metal.

13. The enclosure panel of claim 1 wherein said main panel body is fabricated out of a fiberboard material and said insert opening cover is fabricated out of a plastic material.

* * * * *